(12) United States Patent
Koike et al.

(10) Patent No.: US 6,617,061 B2
(45) Date of Patent: Sep. 9, 2003

(54) GROUP III NITRIDE COMPOUND SEMICONDUCTOR DEVICE AND GROUP III NITRIDE COMPOUND SEMICONDUCTOR LIGHT-EMITTING DEVICE

(75) Inventors: Masayoshi Koike, Nishikasugai-gun (JP); Shiro Yamasaki, Nishikasugai-gun (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 10/252,723

(22) Filed: Sep. 24, 2002

(65) Prior Publication Data

US 2003/0022028 A1 Jan. 30, 2003

Related U.S. Application Data

(62) Division of application No. 09/730,005, filed on Dec. 6, 2000, now Pat. No. 6,541,798.

(30) Foreign Application Priority Data

Dec. 6, 1999 (JP) .......................................... P. 11-346445

(51) Int. Cl.[7] .............................................. H01L 33/00
(52) U.S. Cl. ........................ 428/698; 428/697; 428/220; 428/336; 257/79; 257/94; 257/103; 257/13; 372/43
(58) Field of Search ................................. 428/689, 697, 428/698, 220, 336; 257/79, 88, 94, 97, 13, 103; 372/43

(56) References Cited

U.S. PATENT DOCUMENTS 5,945,689 A 8/1999 Koike et al. .................. 257/88

6,288,416 B1 * 9/2001 Koike et al. .................. 257/94
6,376,866 B1 * 4/2002 Shakuda ..................... 257/103
6,541,798 B2 * 4/2003 Koike et al. .................. 257/94

FOREIGN PATENT DOCUMENTS

| JP | 08264831 A | * 10/1996 |
| JP | 08264832 A | * 10/1996 |
| JP | 9-36430 | 2/1997 |
| JP | 09036422 A | * 2/1997 |
| JP | 09036423 A | * 2/1997 |
| JP | 9-232629 | 9/1997 |
| JP | 10-335757 | 12/1998 |
| JP | 11-191639 | 7/1999 |
| JP | 11-195812 | 7/1999 |
| JP | 11-214746 | 8/1999 |
| JP | 2000-68594 | 3/2000 |
| JP | 2000068594 A | 3/2000 |

* cited by examiner

Primary Examiner—Deborah Jones
Assistant Examiner—Stephen Stein
(74) Attorney, Agent, or Firm—McGinn & Gibb, PLLC

(57) ABSTRACT

A clad layer is provided as a multilayer structure made of an alternate laminate of 20 layers of $Al_{0.2}Ga_{0.8}N$ 50 nm thick and 20 layers of $Ga_{0.99}In_{0.01}N$ 20 nm thick. The clad layer about 1.4 $\mu$m thick has a low elastic constant because the clad layer is provided as a multilayer structure. In a laser diode, it is useful that another layer such as a guide layer requiring a band gap of aluminum gallium nitride ($Al_xGa_{1-x}N$ 0<x<1) is provided as a multilayer structure made of aluminum gallium nitride ($Al_xGa_{1-x}N$ 0<x<1) and gallium indium nitride ($Ga_yGa_{1-y}N$ 0<y<1).

3 Claims, 4 Drawing Sheets

US 6,617,061 B2

GROUP III NITRIDE COMPOUND SEMICONDUCTOR DEVICE AND GROUP III NITRIDE COMPOUND SEMICONDUCTOR LIGHT-EMITTING DEVICE

This Application is a Divisional of U.S. application Ser. No. 09/730,005, now U.S. Pat. No. 6,541,798, filed Dec. 6, 2000, which is pending, the entire contents of which are incorporated herein by reference.

BACKGROUND OF THE INVENTION

1. Field of the Invention

The present invention relates to a Group III nitride compound semiconductor device. The present invention is particularly useful for a Group III nitride compound semiconductor device functioning as a light-emitting device such as a light-emitting diode (LED), a laser diode (LD), or the like. Incidentally, the Group III nitride compound semiconductor device is represented by the general formula $Al_xGa_yIn_{1-x-y}N$ ($0 \leq x \leq 1$, $0 \leq y \leq 1$, $0 \leq x+y \leq 1$), which includes binary compounds such as AlN, GaN and InN; ternary compounds such as $Al_xGa_{1-x}N$, $Al_xIn_{1-x}N$ and $Ga_xIn_{1-x}N$ (each $0<x<1$); and quarternary compounds such as $Al_xGa_yIn_{1-x-y}N$ ($0<x<1$, $0<y<1$, $0<x+y<1$). In this specification, the concept "Group III nitride compound semiconductor" includes a Group III nitride compound semiconductor doped with impurities to form a p-type or an n-type as the conduction type if there is no notice.

The present application is based on Japanese Patent Application No. Hei. 11-353139, which is incorporated herein by reference.

2. Description of the Related Art

The Group III nitride compound semiconductor is a direct transition type semiconductor exhibiting an emission spectrum in a wide range of from ultraviolet to red. The Group III nitride compound semiconductor is applied to a light-emitting device such as a light-emitting diode (LED), a laser diode (LD), or the like. Generally, sapphire is used as a substrate for the Group III nitride compound semiconductor. The Group III nitride compound semiconductor is formed on the substrate. In this case, a so-called clad layer is provided so that electrons from a negative electrode and holes from a positive electrode make pairs in a light-emitting layer. In the Group III nitride compound semiconductor light-emitting device, $Al_xGa_{1-x}N$ ($0<x<1$) containing aluminum (Al) is generally used as the clad layer.

FIG. 3 shows a structure of a light-emitting diode (LED) 900 as an example of the background-art Group III nitride compound semiconductor light-emitting device. The light-emitting diode (LED) 900 has a sapphire substrate 901, and an AlN buffer layer 902 formed on the sapphire substrate 901.

An n-type layer 903 of GaN doped with silicon (Si), an n-type clad layer 904 of $Al_xGa_{1-x}N$ doped with silicon (Si), and an active layer 905 of a multiple quantum well structure (MQW) made of an alternate lamination of well layers of $Ga_yIn_{1-y}N$ and barrier layers of GaN are formed successively on the buffer layer 902. A p-type clad layer 906 of $Al_xGa_{1-x}N$ doped with magnesium (Mg) and a p-type contact layer 907 of GaN doped with magnesium (Mg) are further formed on the active layer 905. An electrode 908A is formed on the p-type contact layer 907. On the other hand, an electrode 908B is formed on the n-type layer 903.

In the above background art, however, the n-type and p-type clad layers of $Al_xGa_{1-x}N$ ($0<x<1$) are apt to crack because the n-type and p-type clad layers are so thick as to be high in elastic constant. Hence, there is a problem that device characteristic runs short.

SUMMARY OF THE INVENTION

An object of the present invention is to provide a Group III nitride compound semiconductor device and a Group III nitride compound semiconductor light-emitting device in which the elastic constant of thick layers of AlxGa1-xN ($0<x<1$) is reduced so that lowering of device function is avoided.

In order to achieve the above object, according to an aspect of the present invention, there is provided a Group III nitride compound semiconductor device comprising at least three layers of $Al_xGa_{1-x}N$ ($0<x<1$), and at least three layers of $Ga_yIn_{1-y}N$ ($0<y<1$), wherein the $Al_xGa_{1-x}N$ layers and the $Ga_yIn_{1-y}N$ layers are laminated alternately.

According to another aspect of the present invention, in the above group III nitride compound semiconductor device, each of the layers of $Ga_yIn_{1-y}N$ ($0<y<1$) has a thickness in a range of from 15 nm to 30 nm, inclusively.

According to a further aspect of the present invention, in the above group III nitride compound semiconductor device, the above group III nitride compound semiconductor device is made to be a light-emitting device.

In the Group III nitride compound semiconductor device, a layer requiring a wide band gap demands $Al_xGa_{1-x}N$ ($0<x<1$). Therefore, when the layer is formed as a multilayer structure of $Al_xGa_{1-x}N$ ($0<x<1$) and $Ga_yIn_{1-y}N$ ($0<y<1$), the layer can be provided as a layer having a wide band gap of $Al_xGa_{1-x}N$ ($0<x<1$) and having a small elastic constant as a whole. Hence, cracking caused by the temperature change, or the like, at the time of production and use can be suppressed. This effect is particularly remarkable in a layer of $Al_xGa_{1-x}N$ ($0<x<1$) containing a large amount of $Al_x$. When a plurality of $Al_xGa_{1-x}N$ ($0<x<1$) layers are formed, total characteristic design of the Group III nitride compound semiconductor device, especially design of the light-emitting layer (composition of $Al_xGa_yIn_{1-x-y}N$) can be performed more flexibly.

When the thickness of a layer of $Ga_yIn_{1-y}N$ ($0<y<1$) is selected to be in a range of from 15 nm to 30 nm inclusively, cracking can be suppressed approximately perfectly while the function of the layer requiring a wide band gap can be kept high. Incidentally, if the thickness is smaller than 15 nm, the effect of reducing the elastic constant of the laminate of layers of $Al_xGa_{1-x}N$ ($0<x<1$) and layers of $Ga_yIn_{1-y}N$ ($0<y<1$) is insufficient. If the thickness is larger than 30 nm, the function of the layer requiring a wide band gap is lowered. The aforementioned device is useful as a light-emitting device such as a laser diode, a light-emitting device, or the like.

Features and advantages of the invention will be evident from the following detailed description of the preferred embodiments described in conjunction with the attached drawings.

DETAILED DESCRIPTION OF THE PREFERRED EMBODIMENTS

The present invention will be described below on the basis of specific embodiments thereof. Incidentally, the present invention is not limited to the following embodiments.

First Embodiment

Figure 1:
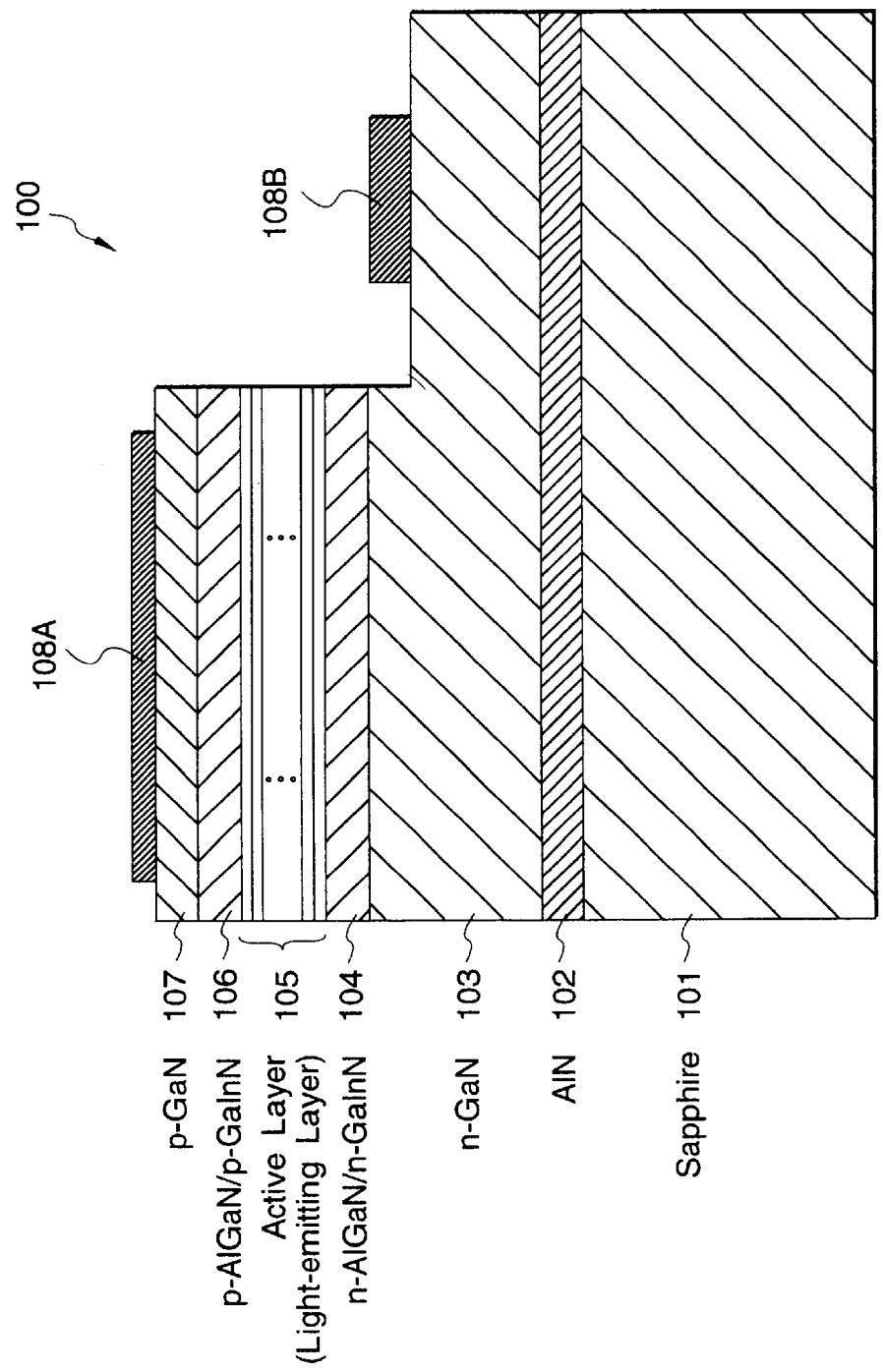
FIG. 1 is a sectional view showing a structure of a light-emitting diode according to a specific embodiment of the present invention.

FIG. 1 shows a structure of a light-emitting diode (LED) 100 according to a first specific embodiment of the present invention. The light-emitting diode (LED) 100 has a sapphire substrate 101, and a 50 nm-thick buffer layer 102 of AlN formed on the sapphire substrate 101.

An n-type layer 103 of silicon (Si)-doped GaN having a thickness of about 4.0 $\mu$m and having a silicon (Si) concentration of $5 \times 10^{18}/cm^3$ is formed on the buffer layer 102. An n-type clad layer 104 of a multilayer structure having a thickness of about 1.4 $\mu$m is formed on the n-type layer 103. The n-type clad layer 104 is made of an alternate laminate of 20 layers of silicon (Si)-doped $Al_{0.2}Ga_{0.8}N$ having a silicon (Si) concentration of $5 \times 10^{18}/cm^3$ and having a thickness of 50 nm and 19 layers of silicon (Si)-doped $Ga_{0.99}In_{0.01}N$ having a silicon (Si) concentration of $5 \times 10^{18}/cm^3$ and having a thickness of 20 nm.

A light-emitting layer 105 of a multiple quantum well structure (MQW) made of an alternate laminate of well layers of $Ga_{0.98}In_{0.02}N$ having a thickness of about 3 nm and barrier layers of $Al_{0.05}Ga_{0.95}N$ having a thickness of about 5 nm is formed on the n-type clad layer 104 of a multilayer structure. The well layers are 4 layers. The barrier layers are 3 layers. A p-type clad layer 106 of a multilayer structure having a thickness of about 1.4 $\mu$m is formed on the light-emitting layer 105 of a multiple quantum well structure (MQW). The p-type clad layer 106 is made of an alternate laminate of 20 layers of magnesium (Mg)-doped $Al_{0.2}Ga_{0.8}N$ having a magnesium (Mg) concentration of $7 \times 10^{19}/cm^3$ and having a thickness of 50 nm and 19 layers of magnesium (Mg)-doped $Ga_{0.99}In_{0.01}N$ having a magnesium (Mg) concentration of $7 \times 10^{19}/cm^3$ and having a thickness of 20 nm. A p-type contact layer 107 of magnesium (Mg)-doped GaN having a thickness of 200 nm and having a magnesium (Mg) concentration of $1 \times 10^{20}/cm^3$ is formed on the p-type clad layer 106 of a multilayer structure. An Ni electrode 108A is formed on the p-type contact layer 107. On the other hand, an electrode 108B of Al is formed on the n-type layer 103.

A method of producing the light-emitting diode configured as described above will be described below. The light-emitting device 100 was formed by vapor phase epitaxy according to a metal organic vapor phase epitaxy method (hereinafter referred to as "MOVPE"). Gasses used were $NH_3$, carrier gas $H_2$ or $N_2$, trimethylgallium ($Ga(CH_3)_3$, hereinafter referred to as "TMG"), trimethylaluminum ($Al(CH_3)_3$, hereinafter referred to as "TMA"), trimethylindium ($In(CH_3)_3$, hereinafter referred to as "TMI"), silane ($SiH_4$) and cyclopentadienylmagnesium ($Mg(C_5H_5)_2$, hereinafter referred to as "$CP_2Mg$").

First, the monocrystalline sapphire substrate 1 having a face a cleaned by an organic cleaning and heating process as a main surface was attached to a susceptor placed in a reaction chamber of an MOVPE apparatus. Then, the sapphire substrate 101 was baked at 1100° C. while $H_2$ was poured into the reaction chamber at ordinary temperature and at a flow rate of 10 L/min for about 30 minutes.

Then, after the temperature was reduced to 400° C., 10 L/min of $H_2$, 10 L/min of $NH_3$ and 20 $\mu$mol/min of TMA were supplied for about 90 seconds to thereby form an AlN buffer layer 102 about 50 nm thick. Then, the temperature of the sapphire substrate 101 was kept at 1150° C., 10 L/min of $H_2$, 10 L/min of $NH_3$, 200 $\mu$mol/min of TMG and 20 nmol/min of silane ($SiH_4$) diluted to 0.86 ppm with $H_2$ gas were imported to thereby form an n-type layer 103 of silicon (Si)-doped GaN having a thickness of about 4.0 $\mu$m and a silicon (Si) concentration of $5 \times 10^{18}/cm^3$.

After the n-type layer 103 was formed, $N_2$ or $H_2$, $NH_3$, TMA, TMG and silane ($SiH_4$) were supplied to thereby form a layer of $Al_{0.2}Ga_{0.8}N$ about 50 nm thick. Then, $N_2$ or $H_2$, $NH_3$, TMG, TMI and silane ($SiH_4$) were supplied to thereby form a layer of $Ga_{0.99}In_{0.01}N$ about 20 nm thick. 20 layers and 19 layers formed in the aforementioned manner were laminated alternately to thereby form an n-type clad layer 104 of a multilayer structure having a total thickness of about 1.4 $\mu$m.

Then, $N_2$ or $H_2$, $NH_3$ and TMG were supplied to thereby form a well layer of $Ga_{0.98}In_{0.02}N$ about 3 nm thick. Then, $N_2$ or $H_2$, $NH_3$, TMG and TMA were supplied to thereby form a barrier layer of $Al_{0.05}Ga_{0.95}N$ about 5 nm thick. Well layers and barrier layers were further formed in the same condition. Finally, a well layer of $Ga_{0.98}In_{0.02}N$ about 3 nm thick was formed. Thus, a light-emitting layer 105 of an MQW structure made of a laminate of 4 quantum well layers and 3 barrier layers was formed.

Then, $N_2$ or $H_2$, $NH_3$, TMA, TMG and $CP_2Mg$ were supplied to thereby form a layer of $Al_{0.2}In_{0.9}N$ about 50 nm thick. Then, $N_2$ or $H_2$, $NH_3$, TMG, TMI and $CP_2Mg$ were supplied to thereby form a layer of $Ga_{0.99}In_{0.01}N$ about 20 nm thick. These layers were formed by 20 layers and 19 layers in the same condition and were laminated alternately to thereby form a p-type clad layer 106 of a multilayer structure having a total thickness of about 1.4 $\mu$m.

Then, while the temperature was kept at 1100° C., 10 L/min of $N_2$ or $H_2$, 10 L/min of $NH_3$, 50 $\mu$mol/min of TMG and 0.15 $\mu$mol/min of $CP_2Mg$ were imported to thereby form a p-type contact layer 107 of magnesium (Mg)-doped GaN having a thickness of about 200 nm and a magnesium (Mg) concentration of $1 \times 10^{20}/cm^3$.

Then, the p-type contact layer 107 and the p-type clad layer 106 were uniformly irradiated with electron beams by an electron-beam irradiation apparatus. Thus, a low-resistance wafer of a multilayer structure was formed.

Then, an $SiO_2$ layer was formed by sputtering. A photo resist was applied onto the $SiO_2$ layer. Photolithography was made. Then, a part of the photo resist was removed from an electrode-forming portion of the n-type layer 103. A portion of the $SiO_2$ layer not covered with the photo resist was removed with a hydrofluoric acid type etching solution.

Then, portions of the p-type contact layer 107, the p-type clad layer 106, the active layer 105, the n-type clad layer 104 and the n-type layer 103 covered with neither photo resist nor $SiO_2$ layer were partially dry-etched while 10 ml/min of $Cl_2$ gas was supplied in the condition of the degree of vacuum of 0.04 Torr and high-frequency electric power of 0.44 W/cm². Then, they were dry-etched with Ar. In this process, a region for taking out an electrode from the n-type layer 103 was formed.

Then, nickel (Ni) was evaporated to thereby form an electrode 108A on the p-type contact layer 107. On the other hand, aluminum (Al) was evaporated to thereby form an electrode 108B on the n-type layer 103.

The light-emitting diode 100 thus obtained was prevented from cracking. Hence, the light-emitting diode 100 was obtained as a high-output light-emitting diode compared with the background-art light-emitting diode having a single clad layer.

Second Embodiment

Figure 2:
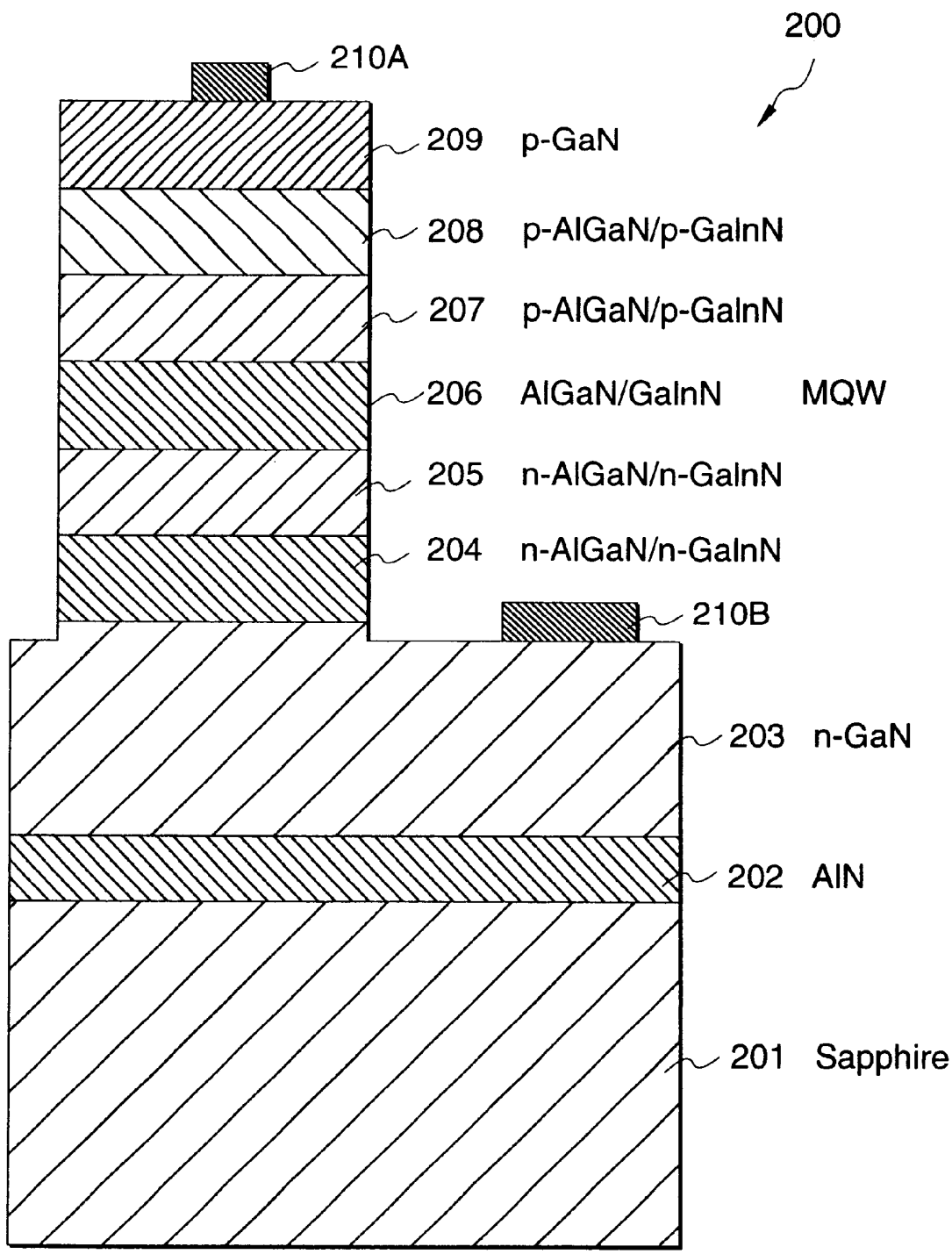
FIG. 2 is a sectional view showing a structure of a light-emitting diode according to a specific embodiment of the present invention.
Figure 3:
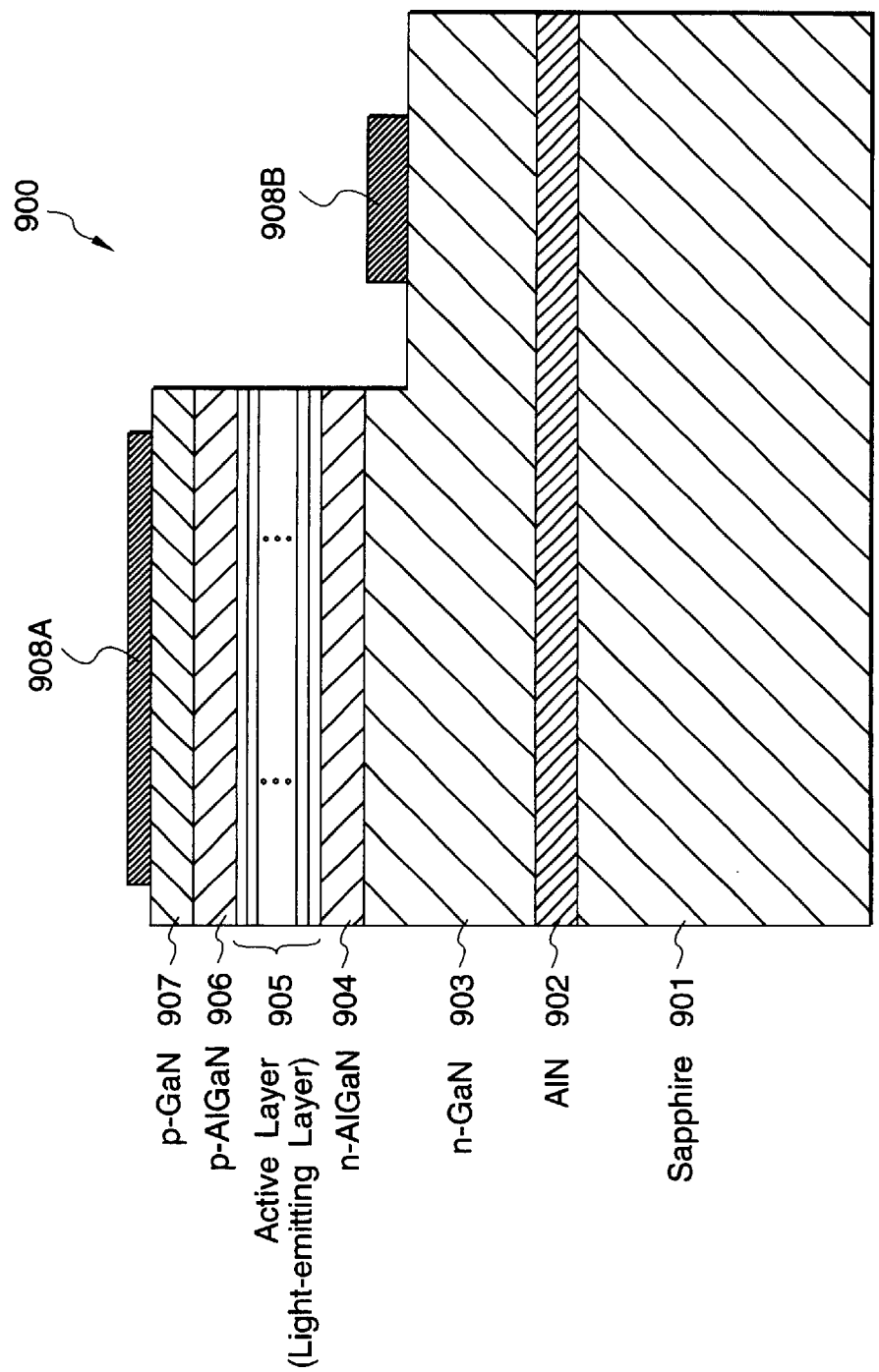
FIG. 3 is a sectional view showing a structure of a background-art light-emitting diode.
Figure 4:
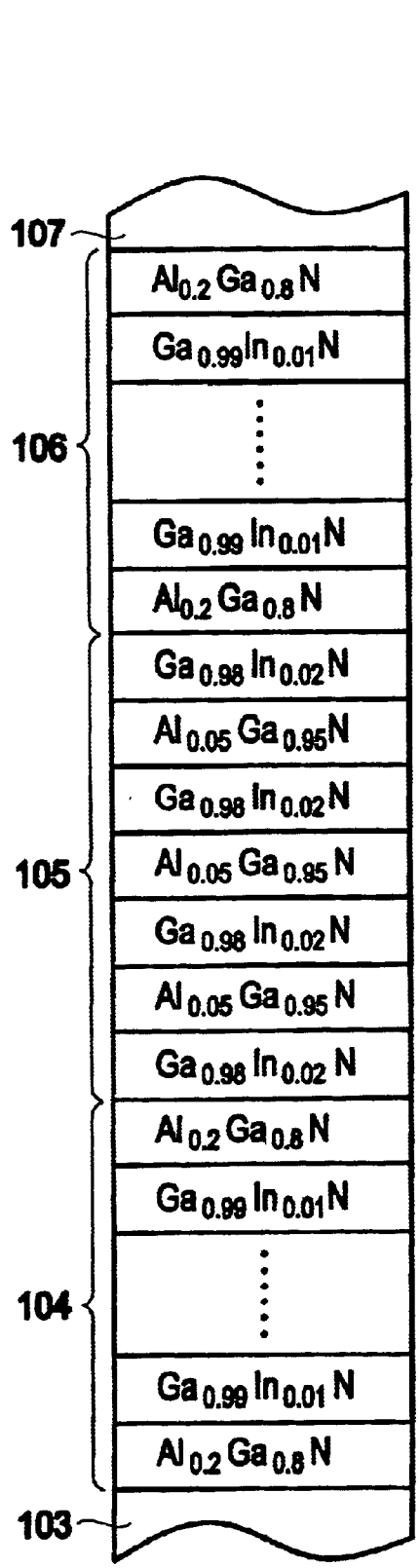
FIG. 4 is a schematic illustration of the laminate structure of the clad and well layers of the diode of FIG. 1.
Figure 5:
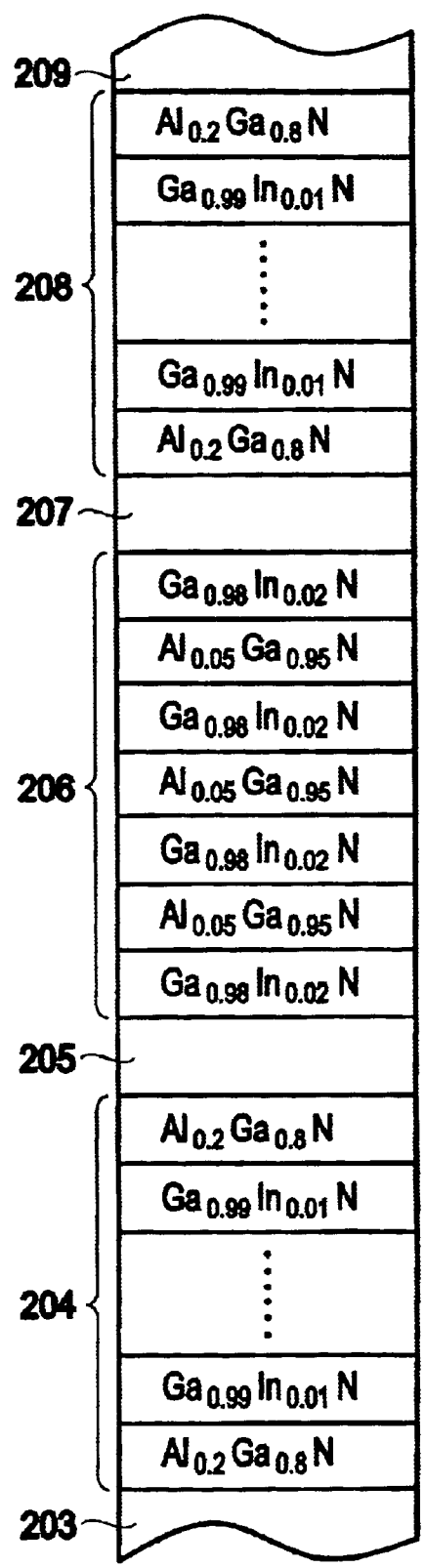
FIG. 5 is a schematic illustration of the laminate structure of the clad and well layers of the diode of FIG. 2.

FIG. 2 is a sectional view showing a structure of a laser diode 200 according to a specific embodiment of the present invention. The laser diode 200 has a sapphire substrate 201, and a 50 nm-thick buffer layer 202 of AlN formed on the sapphire substrate 201.

An n-type layer 203 of silicon (Si)-doped GaN having a thickness of about 4.0 $\mu$m and having a silicon (Si) concentration of $5\times10^{18}/cm^3$ is formed on the buffer layer 202. An n-type clad layer 204 of a multilayer structure having a thickness of about 1.4 $\mu$m is formed on the n-type layer 203. The n-type clad layer 204 is made of an alternate laminate of 20 layers of silicon (Si)-doped $Al_{0.2}Ga_{0.8}N$ having a silicon (Si) concentration of $5\times10^{18}/cm^3$ and having a thickness of 50 nm and 19 layers of silicon (Si)-doped $Ga_{0.99}In_{0.01}N$ having a silicon (Si) concentration of $5\times10^{18}/cm^3$ and having a thickness of 20 nm.

An n-type guide layer 205 of a multilayer structure having a total thickness of about 120 nm is formed on the n-type clad layer 204 of a multilayer structure. The n-type guide layer 205 is made of a combination of two layers of silicon (Si)-doped $Al_{0.1}Ga_{0.9}N$ and one layer of silicon (Si)-doped $Ga_{0.99}In_{0.01}N$ sandwiched between the two layers. The two layers of silicon (Si)-doped $Al_{0.1}Ga_{0.9}N$ have a silicon (Si) concentration of $1\times10^{18}/cm^3$ and have a thickness of 50 nm. The one layer of silicon (Si)-doped $Ga_{0.99}In_{0.01}N$ has a silicon (Si) concentration of $1\times10^{18}/cm^3$ and has a thickness of 20 nm.

An active layer 206 of a multiple quantum well structure (MQW) made of an alternate laminate of well layers of $Ga_{0.98}In_{0.02}N$ having a thickness of about 3 nm and barrier layers of $Al_{0.05}Ga_{0.95}N$ having a thickness of about 5 nm is formed on the n-type guide layer 205 of a multilayer structure. The well layers are 4 layers. The barrier layers are 3 layers. A p-type guide layer 207 of a multilayer structure having a total thickness of about 120 nm is formed on the active layer 206 of a multiple quantum well structure (MQW). The p-type guide layer 207 is made of a combination of two layers of magnesium (Mg)-doped $Al_{0.1}Ga_{0.9}N$ and one layer of magnesium (Mg)-doped $Ga_{0.99}In_{0.01}N$ sandwiched between the two layers. The two layers of magnesium (Mg)-doped $Al_{0.1}Ga_{0.9}N$ have a magnesium (Mg) concentration of $7\times10^{19}/cm^3$ and have a thickness of 50 nm. The one layer of magnesium (Mg)-doped $Ga_{0.99}In_{0.01}N$ has a magnesium (Mg) concentration of $7\times10^{19}/cm^3$ and has a thickness of 20 nm.

A p-type clad layer 208 of a multilayer structure having a total thickness of about 1.4 $\mu$m is formed on the p-type guide layer 207 of a multilayer structure. The p-type clad layer 208 is made of an alternate laminate of 20 layers of magnesium (Mg)-doped $Al_{0.2}Ga_{0.8}N$ having a magnesium (Mg) concentration of $7\times10^{19}/cm^3$ and having a thickness of 50 nm and 19 layers of magnesium (Mg)-doped $Ga_{0.99}In_{0.01}N$ having a magnesium (Mg) concentration of $7\times10^{19}/cm^3$ and having a thickness of 20 nm. A p-type contact layer 209 of magnesium (Mg)-doped GaN having a thickness of 200 nm and having a magnesium (Mg) concentration of $1\times10^{20}/cm^3$ is formed on the p-type clad layer 208 of a multilayer structure. An Ni electrode 210A is formed on the p-type contact layer 209. On the other hand, an electrode 210B of Al is formed on the n-type layer 203.

A method of producing the light-emitting device (semiconductor laser) configured as described above will be described below. The light-emitting device 200 was produced by vapor phase epitaxy according to a metal organic vapor phase epitaxy method (hereinafter referred to as "MOVPE").

First, the monocrystalline sapphire substrate 201 having a face a cleaned by an organic cleaning and heating process as a main surface was attached to a susceptor placed in a reaction chamber of an MOVPE apparatus. Then, the sapphire substrate 201 was baked at 1100° C. while $H_2$ was poured into the reaction chamber at ordinary temperature and at a flow rate of 10 L/min for about 30 minutes.

Then, after the temperature was reduced to 400° C., 10 L/min of $H_2$, 10 L/min of $NH_3$ and 20 $\mu$mol/min of TMA were supplied for about 90 seconds to thereby form an AlN buffer layer 202 about 50 nm thick. Then, the temperature of the sapphire substrate 201 was kept at 1150° C., 10 L/min of $H_2$, 10 L/min of $NH_3$, 200 $\mu$mol/min of TMG and 20 nmol/min of silane ($SiH_4$) diluted to 0.86 ppm with $H_2$ gas were imported to thereby form an n-type layer 203 of silicon (Si)-doped GaN having a thickness of about 4.0 $\mu$m and a silicon (Si) concentration of $5\times10^{18}/cm^3$.

After the n-type layer 203 was formed, $N_2$ or $H_2$, $NH_3$, TMA, TMG and silane ($SiH_4$) were supplied to thereby form a layer of $Al_{0.2}Ga_{0.8}N$ about 50 nm thick. Then, $N_2$ or $H_2$, $NH_3$, TMG, TMI and silane ($SiH_4$) were supplied to thereby form a layer of $Ga_{0.99}In_{0.01}N$ about 20 nm thick. These layers were formed by 20 layers and 19 layers in the same condition and were laminated alternately to thereby form an n-type clad layer 204 of a multilayer structure having a total thickness of about 1.4 $\mu$m.

Then, $N_2$ or $H_2$, $NH_3$, TMA, TMG and silane ($SiH_4$) were supplied to thereby form a layer of $Al_{0.1}Ga_{0.9}N$ about 50 nm thick. Then, $N_2$ or $H_2$, $NH_3$, TMG, TMI and silane ($SiH_4$) were supplied to thereby form a layer of $Ga_{0.99}In_{0.01}N$ about 20 nm thick. A layer of $Al_{0.1}Ga_{0.9}N$ about 50 nm thick was further formed. Thus an n-type guide layer 205 of a multilayer structure having a total thickness of about 120 nm was formed.

Then, $N_2$ or $H_2$, $NH_3$, TMG and TMI were supplied to thereby form a well layer of $Ga_{0.98}In_{0.02}N$ about 3 nm thick. Then, $N_2$ or $H_2$, $NH_3$, TMG and TMA were supplied to thereby form a barrier layer of $Al_{0.05}Ga_{0.95}N$ about 5 nm thick. Well layers and barrier layers were further formed in the same condition. Finally, a well layer of $Ga_{0.98}In_{0.02}N$ about 3 nm thick was formed. Thus, an active layer 206 of an MQW structure made of a laminate of 4 well layers and 3 barrier layers was formed.

Then, $N_2$ or $H_2$, $NH_3$, TMA, TMG and $CP_2Mg$ were supplied to thereby form a layer of $Al_{0.1}Ga_{0.9}N$ about 50 nm thick. Then, $N_2$ or $H_2$, $NH_3$, TMG, TMI and $CP_2Mg$ were supplied to thereby form a layer of $Ga_{0.99}In_{0.01}N$ about 20 nm thick. A layer of $Al_{0.1}Ga_{0.9}N$ about 50 nm thick was further formed. Thus, a p-type guide layer 207 of a multilayer structure having a total thickness of about 120 nm was formed. Then, $N_2$ or $H_2$, $NH_3$, TMA, TMG and $CP_2Mg$ were supplied to thereby form a layer of $Al_{0.2}Ga_{0.8}N$ about 50 nm thick. Then, $N_2$ or $H_2$, $NH_3$, TMG, TMI and $CP_2Mg$ were supplied to thereby form a layer of $Ga_{0.99}In_{0.01}N$ about 20 nm thick. These layers were formed by 20 layers and 19 layers and were laminated in the same condition. Thus, a p-type clad layer 208 of a multilayer structure having a total thickness of about 1.4 $\mu$m was formed.

Then, while the temperature was kept at 1100° C., 10 L/min of $N_2$ or $H_2$, 10 L/min of $NH_3$, 50 $\mu$mol/min of TMG and 0.15 $\mu$mol/min of $CP_2Mg$ were imported to thereby form a p-type contact layer 209 of magnesium (Mg)-doped GaN having a thickness of about 200 nm.

Then, the p-type contact layer 209, the p-type clad layer 208 and the p-type guide layer 207 were uniformly irradiated with electron beams by an electron-beam irradiation apparatus. Thus, a low-resistance wafer of a multilayer structure was formed.

Then, an $SiO_2$ layer was formed by sputtering. A photo resist was applied onto the $SiO_2$ layer. Photolithography was made. Then, a part of the photo resist was removed from an electrode-forming portion of the n-type layer 203. A portion of the $SiO_2$ layer not covered with the photo resist was removed with a hydrofluoric acid type etching solution.

Then, portions of the p-type contact layer 209, the p-type clad layer 208, the p-type guide layer 207, the active layer 206, the n-type guide layer 205, the n-type clad layer 204 and the n-type layer 203 covered with neither photo resist nor $SiO_2$ layer were partially dry-etched while 10 ml/min of $Cl_2$ gas was supplied in the condition of the degree of vacuum of 0.04 Torr and high-frequency electric power of 0.44 W/cm$^2$. Then, they were dry-etched with Ar. In this process, a region for taking out an electrode from the n-type layer 203 was formed.

Then, nickel (Ni) was evaporated to thereby form an electrode 210A on the p-type contact layer 209. On the other hand, aluminum (Al) was evaporated to thereby form an electrode 210B on the n-type layer 203.

Then, dry etching was performed to form an end surface of a resonator. Then, scribing was performed to form scribe grooves. Dicing was performed in an x-axis direction parallel to the end surface of the resonator. Thus, a strip piece was obtained. The laser diode 200 thus obtained exhibited emission output of 10 mW and an oscillation peak wavelength of 410 nm when a drive current of 50 mA was given. The laser diode 200 was prevented from cracking. Hence, the laser diode 200 was obtained as a high-output laser diode compared with the background-art laser having a single clad layer and a single guide layer.

Although the aforementioned embodiments have shown the case where a light-emitting device is produced by a metal organic vapor phase epitaxy method (MOVPE), the present invention may be applied also to the case where a molecular beam vapor phase epitaxy method (MBE), a halide vapor phase epitaxy method (Halide VPE), or the like, is used as the method of forming a semiconductor layer.

Although the aforementioned embodiments have shown the case where a laser diode having MQW as a light-emitting layer is taken as an example, the structure of the light-emitting device is not limited thereto. A homostructure, a heterostructure or a double-heterostructure may be used as the structure of the light-emitting device. These may be formed by a pin junction, a p-n junction, or the like. A single quantum well structure (SQW) may be used as the structure of the light-emitting layer.

Besides sapphire, silicon (Si), silicon carbide (SiC), spinel ($MgAl_2O_4$), ZnO, MgO or Group III nitride compound semiconductor such as gallium nitride (GaN) may be used as the substrate on which the group III nitride compound semiconductor is formed. Although the buffer layer is formed to correct lattice mismatching with respect to the sapphire substrate to thereby form the Group III nitride compound semiconductor of good crystallinity on the sapphire substrate, it is preferable that the buffer layer is provided also when another substrate is used. A Group III nitride compound semiconductor $Al_xGa_yIn_{1-x-y}N$ ($0 \leq x \leq 1$, $0 \leq y \leq 1$, $0 \leq x+y \leq 1$) formed at a low temperature, especially $Al_xGa_{1-x}N$ ($0 \leq x \leq 1$), is preferably used as the buffer layer.

The present invention can be applied substantially also to the case where the Group III elements in the Group III nitride compound semiconductor are partially replaced by boron (B) or thallium (Tl) or to the case where the nitrogen (N) is partially replaced by phosphorus (P), arsenic (As), antimony (Sb) or bismuth (Bi). Incidentally, when a light-emitting device is formed, it is originally preferable that binary or ternary compounds in the Group III nitride compound semiconductor are used.

Although the aforementioned embodiments have shown the case where the composition ratio of Group III nitride compound semiconductors in each of unit layers of multilayer structures in the clad layer 104 or 106 or 204 or 208 and the guide layer 205 or 207 and in the well and barrier layers in the MQW structure light-emitting layer is taken as an example, the optional general formula $Al_xGa_yIn_{1-x-y}N$ ($0 \leq x \leq 1$, $0 \leq y \leq 1$, $0 \leq x+y \leq 1$) may be used. In this case, layers may be different in aluminum component x, gallium component y and indium compount 1-x-y.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A Group III nitride compound semiconductor device comprising at least three layers of $Al_xGa_{1-x}N$ (0<x<1), and at least three layers of $Ga_yIn_{1-y}N$ (0<y<1), said $Al_xGa_{1-x}N$ layers and said $Ga_yIn_{1-y}N$ layers being laminated alternately, wherein each of said layers of $Ga_yIn_{1-y}N$ (0<y<1) has a thickness in a range of from 15 nm to 30 nm, inclusively.

2. A Group III nitride compound semiconductor light-emitting device, comprising a Group III nitride compound semiconductor device including at least three layers of $Al_xGa_{1-x}N$ (0<x<1) and at least three layers of $Ga_yIn_{1-y}N$ (0<y<1), wherein said $Al_xGa_{1-x}N$ layers and said $Ga_yIn_{1-y}N$ layers are laminated alternately and each of said layers of $Ga_yIn_{1-y}N$ (0<y<1) has a thickness in a range of from 15 nm to 30 nm, inclusively.

3. A Group III nitride compound semiconductor light-emitting device according to claim 2, wherein said light-emitting device is a laser diode.

\* \* \* \* \*